US007957716B2

(12) United States Patent
Ganger et al.

(10) Patent No.: US 7,957,716 B2
(45) Date of Patent: Jun. 7, 2011

(54) BASEBAND FILTERS FOR USE IN WIRELESS COMMUNICATION DEVICES

(75) Inventors: Jeff Ganger, Chandler, AZ (US); Niall Duncan, Grange (IE); Michael L. Gomez, Tempe, AZ (US); Christian J. Rotchford, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 421 days.

(21) Appl. No.: 12/180,936

(22) Filed: Jul. 28, 2008

(65) Prior Publication Data
US 2010/0022215 A1  Jan. 28, 2010

(51) Int. Cl.
*H04B 1/26* (2006.01)
*H04B 1/16* (2006.01)
(52) U.S. Cl. .................. 455/323; 455/307; 455/334
(58) Field of Classification Search .......... 455/323, 455/118, 190.1, 307, 334, 552.1, 339, 340, 455/20; 370/320, 335, 342
See application file for complete search history.

(56) References Cited

U.S. PATENT DOCUMENTS

| | | | |
|---|---|---|---|
| 6,583,662 B1 | 6/2003 | Lim | |
| 6,970,515 B1 | 11/2005 | Bicakci et al. | |
| 7,039,093 B2 * | 5/2006 | Rouphael et al. | 375/141 |
| 7,088,985 B2 | 8/2006 | Ismail | |
| 7,184,741 B2 * | 2/2007 | Elder et al. | 455/333 |
| 7,233,772 B1 * | 6/2007 | Darabi et al. | 455/20 |
| 7,283,840 B2 * | 10/2007 | Cho | 455/552.1 |
| 7,613,439 B2 * | 11/2009 | Kavadias | 455/260 |
| 7,676,211 B2 * | 3/2010 | Martin et al. | 455/307 |
| 2007/0262894 A1 | 11/2007 | Nicollini et al. | |

FOREIGN PATENT DOCUMENTS
EP  1601113 A1  11/2005

OTHER PUBLICATIONS

Zumbahlen, Hank, Using the Analog Devices Active Filter Design Tool, Analog Devices, AN-649, Application Notes, 2003.
Kugelstadt, Thomas, Active Filter Design Techniques, Literature No. SLOA088, Texas Instruments, 2008.
Au, Tai-Ling Danielle, Programmable, Low-noise, High-linearity Baseband Filter for a Fully-Integrated, Multi-Standard, CMOS RF Receiver, University of California, Berkeley, 1998.

* cited by examiner

*Primary Examiner* — Sonny Trinh
(74) *Attorney, Agent, or Firm* — Ingrassia Fisher & Lorenz, P.C.

(57) ABSTRACT

An embodiment of a baseband filter in a transmitter subsystem of a wireless device comprises an operational amplifier (op-amp), a pole circuit, a feedback capacitor, and an active device. The op-amp is adapted to produce an amplified signal that includes noise gain produced by the op-amp. The pole circuit is electrically coupled with an output terminal of the op-amp, and is adapted to receive the amplified signal and to attenuate the noise gain to produce a filtered, amplified signal. The feedback capacitor is electrically coupled between the first pole circuit and an input terminal of the op-amp, and is adapted to compensate for a phase shift produced by the pole circuit. The active device is electrically coupled with the pole circuit, and is adapted to amplify the filtered, amplified signal and to produce a baseband filtered output signal.

21 Claims, 6 Drawing Sheets

BASEBAND FILTERS FOR USE IN WIRELESS COMMUNICATION DEVICES

TECHNICAL FIELD

Embodiments of the inventive subject matter relate to baseband filters, and more particularly to baseband filters for use in wireless communication devices.

BACKGROUND

Wireless device transmissions often are subject to governmental regulations (e.g., United States Federal Communications Commission (FCC) regulations) regarding the spectral content of transmitted waveforms. In order to filter outgoing signals so that they are in compliance with such regulations, some wireless transceivers include one or more surface acoustic wave (SAW) filters in the radio frequency (RF) portion of their transmitter subsystem. A SAW filter is an electromechanical device that may function in the analog RF domain as a finite impulse response filter. Accordingly, a SAW filter may be used to filter out various out-of-band noise components and spectral images.

Although SAW filters may perform adequately in many circumstances, the component cost of a SAW filter is non-negligible. This cost is multiplied for multi-band wireless transmitters and transceivers, which may include a SAW filter for each supported frequency band. Accordingly, what are needed are relatively low cost apparatus and methods for filtering a signal so that its associated transmitted waveform may comply with regulations regarding spectral content.

DETAILED DESCRIPTION

Embodiments described herein include filters for use in wireless communication devices, and more particularly include baseband filters for use in the transmitter subsystems of wireless communication devices. Embodiments may provide one or more advantages over traditional transmitter apparatus and methods. For example, a filter embodiment described herein may be included in a transmitter subsystem of a wireless communication device in order to filter a signal in a manner that ensures that the device may comply with regulations regarding spectral content. In addition, a filter embodiment described herein may be significantly less expensive to implement in a transmitter subsystem than a surface acoustic wave (SAW) filter, thus reducing manufacturing costs. Accordingly, embodiments include transmitter subsystems and wireless devices that may be "SAW-free", meaning that such transmitter subsystems and wireless devices do not include a SAW filter in the transmitter subsystem for the purpose of filtering the transmitted waveform. This advantage may be particularly significant for multiple band transmitters and/or transceivers, because a plurality of SAW filters may be eliminated from a wireless device design by alternatively including an embodiment of a filter described herein in the wireless device design.

The following description refers to system components, elements, nodes or features being "coupled" together. As used herein, unless expressly stated otherwise, the term "coupled" means that one component/element/node/feature is directly or indirectly joined to (or directly or indirectly communicates with) another component/element/node/feature, and not necessarily mechanically. Thus, although the diagrams shown in FIGS. 1-6 depict various exemplary arrangements of components/elements/nodes/features, additional intervening components, elements, nodes, features, or devices may be present in other embodiments of the depicted subject matter.

Figure 1:
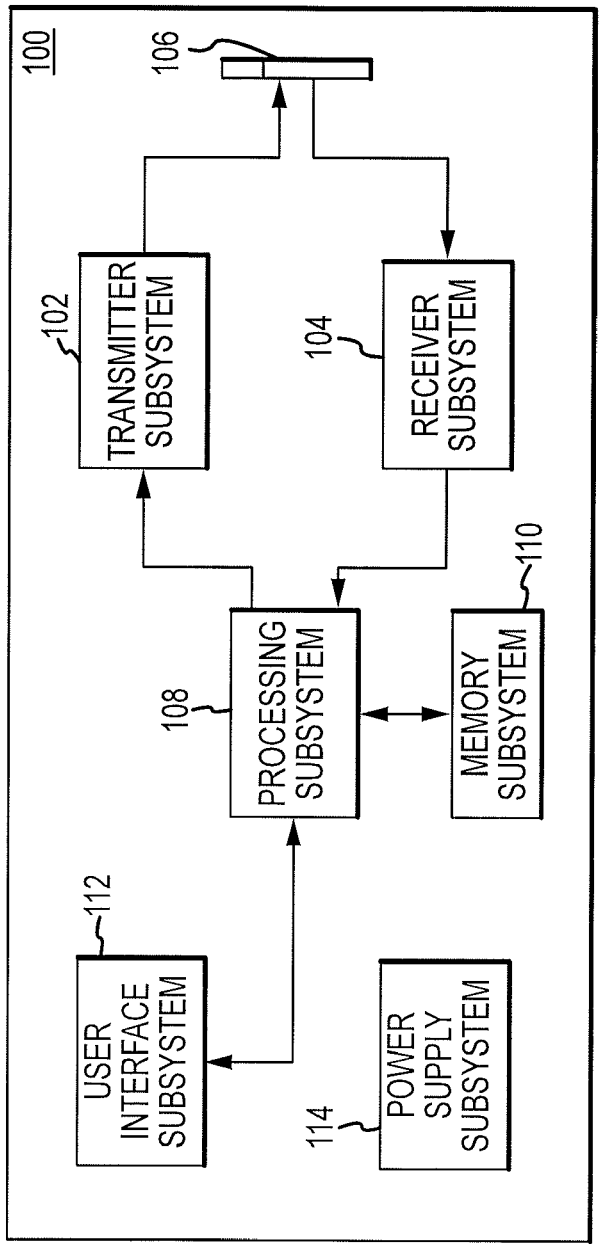
FIG. 1 illustrates a simplified block diagram of a wireless communication device, according to an exemplary embodiment.

FIG. 1 illustrates a simplified block diagram of a wireless communication device 100, in accordance with an exemplary embodiment. Device 100 is adapted to transmit electromagnetic signals over an air interface. Wireless device 100 is adapted to transmit W-CDMA signals over the air interface according to a W-CDMA standard, although wireless device 100 may be adapted to transmit different types of wireless signals over the air interface according to different standards. Wireless device 100 may form substantially all of or a portion of a variety of different types of apparatus. For example, but not by way of limitation, wireless device 100 may form substantially all of or a portion of a cellular telephone, a radio, a personal data assistant (PDA), a computer (e.g., a laptop, notebook, desktop or other type of computer), and/or another device that is adapted to transmit electromagnetic signals over an air interface.

Wireless device 100 comprises a transmitter subsystem 102, receiver subsystem 104, antenna 106, processing subsystem 108, memory subsystem 110, user interface subsystem 112, and power supply subsystem 114. These subsystems are electrically and/or communicatively coupled together as illustrated in FIG. 1, where the term "communicatively coupled" means that information signals are transmissible through various interconnections between the subsystems. The interconnections between the subsystems may be direct interconnections that include conductive transmission media, or may be indirect interconnections that include one or more intermediate electrical components. Although certain interconnections are illustrated in FIG. 1, it is to be understood that more, fewer or different interconnections may be present in other embodiments.

The processing subsystem 108 is adapted to perform various functions. These functions may include, for example, generating outgoing digital signals for transmission by transmitter subsystem 102, processing incoming digital signals received from receiver subsystem 104, interfacing with the memory subsystem 110 to store and retrieve data, interfacing with the user interface subsystem 112, and performing various power control functions in conjunction with the power supply system 114. The power supply system 114 may include, for example, an interface to line power and/or a battery power subsystem.

User interface subsystem 112 may include one or more user interface components adapted to enable a user to input commands or other information into device 100 and/or to provide visual, auditory, or mechanical indicia intended to convey information to the user. For example, but not by way of limitation, user interface subsystem 112 may include one or more display screens, touch screens, lights, speakers, vibration devices, keypads, buttons, dials, and/or other components adapted to receive input commands and/or to produce information-conveying indicia.

Memory subsystem 110 may include one or more components adapted to store digital information in a retrievable format. For example, but not by way of limitation, memory subsystem 110 may include one or more removable or non-removable, volatile or non-volatile memory components, such as ROM-based memory components, RAM-based memory components, CDs, DVDs, and/or magnetic storage media (e.g., hard disks or floppy disks), to name a few.

Receiver subsystem 104 is adapted to receive incoming RF signals from antenna 106, and to perform down-conversion, filtering, and analog-to-digital conversion, among other things, to the incoming RF signals in order to generate incoming digital signals, which may be processed by processing subsystem 108. In an alternate embodiment, for a transmit-only type of device, receiver subsystem 104 may be excluded.

Transmitter subsystem 102 (also referred to herein as a "transmitter" or "RF transmitter") is adapted to receive outgoing digital signals generated by processing subsystem 108, and to perform filtering, digital-to-analog conversion, up-conversion, gain adjustment, and amplification, among other things, to the outgoing digital signals in order to generate outgoing RF signals, which are transmitted over the air interface by antenna 106.

Figure 2:
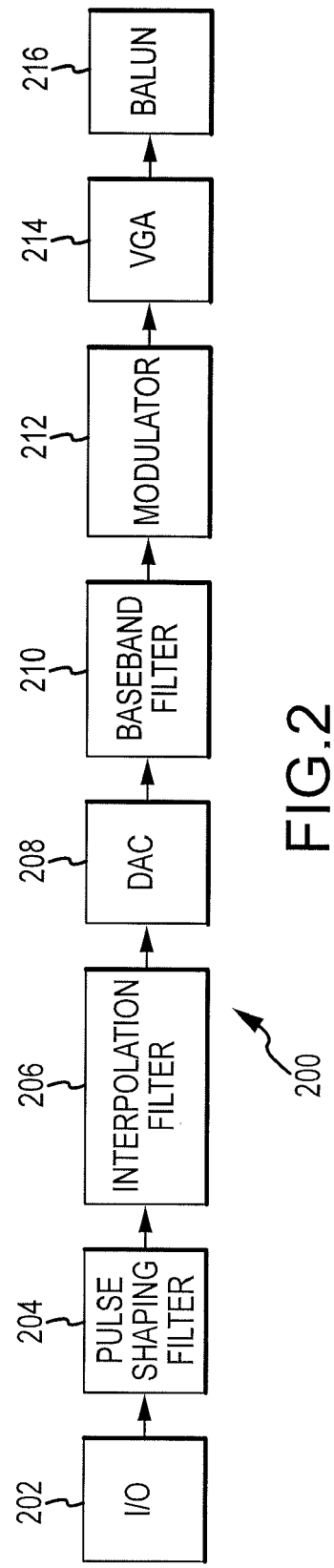
FIG. 2 illustrates a simplified block diagram of a portion of a transmitter subsystem, according to an exemplary embodiment.

FIG. 2 illustrates a simplified block diagram of a portion of a transmitter subsystem 200 (e.g., transmitter subsystem 102, FIG. 1), in accordance with an exemplary embodiment. As will be explained in more detail below, transmitter subsystem 200 is adapted to filter a signal to be transmitted in a manner that may ensure the transmitted signal's compliance with regulations regarding spectral content. Transmitter subsystem 200 may be a "SAW-free" apparatus, as discussed previously. More particularly, as will be described in further detail later, transmitter subsystem 200 includes a baseband filter 210, which is adapted to filter the signal to be transmitted at baseband in order to meet spectral regulations regarding spectral content (e.g., noise response). As will also be explained in further detail later, embodiments of baseband filter 210 are adapted to perform such filtering using relatively low power. Transmitter subsystem 200 also may include an input/output (I/O) block 202, a pulse shaping filter 204, an interpolation filter 206, a digital-to-analog converter (DAC) 208, a modulator 212, a variable gain amplifier (VGA) 214, and a balun 216. Each of these components will be described briefly, below.

Input/output (I/O) 202 receives a stream of digital baseband information (e.g., from processing subsystem 108, FIG. 1), separates the data and control information from the stream, and segments the data and control information into a plurality of frames. Pulse shaping filter 204 is electrically coupled with I/O 202, and is adapted to receive the plurality of frames, and to perform pulse filtering in order to reduce potential intersymbol interference. Pulse shaping filter 204 may include a Square Root Raised Cosine (SRRC) filter, although a Gaussian filter or another type of pulse shaping filters alternatively may be used. Pulse shaping filter 204 produces a plurality of filtered frames. Interpolation filter 206 is electrically coupled with pulse shaping filter 204, and is adapted to receive and interpolate the plurality of filtered frames in order to match the rate of the information carried by the filtered frames with a DAC sample rate. Interpolation filter 206 produces a plurality of interpolated frames. DAC 208 is electrically coupled with interpolation filter 206, and is adapted to receive and sample the plurality of interpolated frames, and to convert the interpolated frames into a complex analog signal (e.g., an analog signal having a real (I) component and an imaginary (Q) component). The sample rate used by DAC 208 may be in a range of about 50 to 70 megahertz (MHz), although the sample rate may be higher or lower.

Baseband filter 210 is electrically coupled with DAC 208, and is adapted to receive and filter the complex analog signal produced by DAC 208. More particularly, baseband filter 210 is configured to filter an analog, input baseband signal produced by DAC 208, and to amplify the signal prior to providing the signal to modulator 212. As will be explained in more detail below, embodiments of baseband filter 210 (e.g., baseband filters 300, 400, 500, 600, FIGS. 3-6) may provide filtering that results in an attenuation of the noise response of a transmitted signal (e.g., a signal transmitted by device 100, FIG. 1) to below a specification threshold without the need for a SAW filter in the transmitter subsystem 200. Various embodiments of baseband filters are illustrated in FIGS. 3-6, and will be described in more detail below.

Modulator 212 is electrically coupled with baseband filter 210, and is adapted to receive the filtered baseband signal produced by baseband filter 210, and to upconvert the baseband signal into an RF frequency band. Modulator 212 may include an Interleaved Switching Modulator (ISM), although other types of modulators alternatively may be used. VGA 214 is electrically coupled with modulator 212, and is adapted to receive the RF signal produced by modulator 212, and to apply a gain to the RF signal for the purpose of transmission power control. VGA 214 may include a Segmented VGA (SVGA), although other types of VGAs alternatively may be used. Balun 216 is electrically coupled with VGA 214, and includes an electromagnetic coupling device adapted to receive and decouple the gain-adjusted RF signal produced by VGA 214, and to provide the decoupled RF signal to an antenna (e.g., antenna 106, FIG. 1) for transmission over the air interface.

Figure 3:
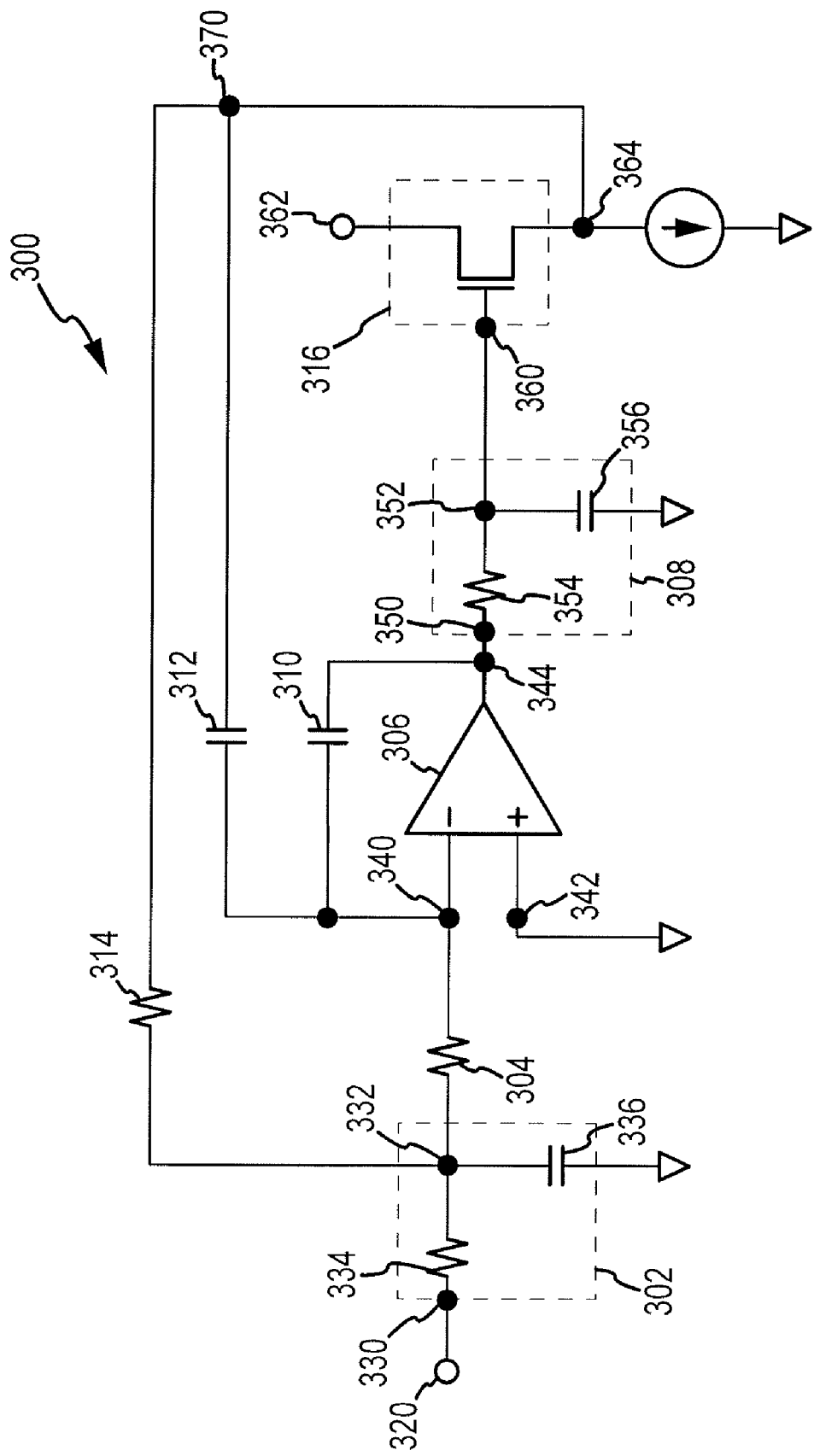
FIG. 3 illustrates a simplified circuit diagram of a portion of a baseband filter, according to an exemplary embodiment.

FIG. 3 illustrates a simplified circuit diagram of a portion of a baseband filter 300 (e.g., baseband filter 210, FIG. 2), according to an exemplary embodiment. Baseband filter 300 may be a multiple feedback filter (e.g., a Rauch filter), which is adapted to provide second order noise shaping of a baseband input signal, as will be explained in more detail below. Baseband filter 300 includes a baseband filter input node 320, a baseband filter output node 370, a resistor/capacitor (RC) filter 302, a resistor 304, an operational amplifier (op-amp) 306, a first pole circuit 308 on an output side of op-amp 306, a first feedback capacitor 310, a second feedback capacitor 312, a feedback resistor 314, and a source follower 316. Baseband filter 300 receives an input signal at baseband filter input node 320, and produces an output signal at baseband filter output node 370. The input signal may include a real or imaginary component of a complex, analog, baseband signal produced by a DAC (e.g., DAC 208, FIG. 2). The output signal may include a filtered real or imaginary component of the complex, analog, baseband signal.

RC filter 302 is electrically coupled between the baseband filter input node 320 and resistor 304, and is adapted to give rise to a pole of baseband filter 300 by shunting certain frequencies of the input signal to ground. RC filter 302 comprises an RC filter input node 330, an RC filter output node 332, a resistor 334, and a capacitor 336. The RC filter input node 330 is electrically coupled with baseband filter input node 320, and the RC filter output node 332 is electrically coupled with op-amp input resistor 304 and with a first terminal of feedback resistor 314. Resistor 334 of RC filter 302 includes a first terminal electrically coupled with the RC filter input node 330, and a second terminal electrically coupled with a first terminal of capacitor 336 and with RC filter output node 332. Capacitor 336 includes the first terminal electrically coupled with the second terminal of resistor 334 and with RC filter output node 332, and a second terminal electrically coupled to ground. During operation, RC filter 302 receives the input signal and produces a first filtered signal at RC filter output node 332.

Resistor 304 includes a first terminal electrically coupled with the RC filter output node 332, and a second terminal electrically coupled with a first op-amp input terminal 340 of op-amp 306. During operation, resistor 304 receives the first filtered signal from RC filter 302, and provides an attenuated signal at its second terminal in order to compensate op-amp 306.

Op-amp 306 is adapted to apply a voltage gain to the attenuated signal received from resistor 304, and thus to provide an amplified signal at its output. Op-amp 306 may include a DC-coupled, high-gain voltage amplifier with differential inputs, and op-amp 306 is controlled by negative feedback, as will be described below. Op-amp 306 may include a voltage feedback amplifier or a current feedback amplifier, in various embodiments. Op-amp 306 includes a first op-amp input terminal 340, a second op-amp input terminal 342, and an op-amp output terminal 344. The first op-amp input terminal 340 corresponds to an inverting input of op-amp 306, and the second op-amp input terminal 342 corresponds to a non-inverting input of op-amp 306. The first op-amp input terminal 340 (and thus the inverting input) may be electrically coupled with the second terminal of resistor 304, with a first terminal of first feedback capacitor 310, and with a first terminal of second feedback capacitor 312. The second op-amp input terminal 342 (and thus the non-inverting input) may be electrically coupled with ground. The op-amp output terminal 344 is electrically coupled with a first pole circuit 308 and with a second terminal of first feedback capacitor 310. Accordingly, first feedback capacitor 310 is electrically coupled between the op-amp output terminal 334 and the first op-amp input terminal 340, and thus forms a portion of the feedback circuitry for op-amp 306. Additionally, first feedback capacitor is electrically coupled between first pole circuit 308 and the first op-amp input terminal 340, and first feedback capacitor 310 is adapted to compensate for the phase shift applied to the signal by first pole circuit 308, which is described below. During operation, op-amp 306 receives the attenuated signal from resistor 304, amplifies the signal, and provides an amplified signal at op-amp output terminal 344.

First pole circuit 308 is electrically coupled between op-amp 306 and source follower 316. First pole circuit 308 is adapted to give rise to another pole of baseband filter 300, and is adapted to filter noise produced by op-amp 306 (e.g., to attenuate the amplifier noise gain) by shunting certain frequencies of the output signal from op-amp 306 to ground. First pole circuit 308 comprises a first pole circuit input node 350, a first pole circuit output node 352, a resistor 354, and a capacitor 356. The first pole circuit input node 350 is electrically coupled with the output terminal 344 of op-amp 306 and with the second terminal of first feedback capacitor 310, and the first pole circuit output node 352 is electrically coupled with source follower 316. Resistor 354 includes a first terminal electrically coupled with the input node 350, and a second terminal electrically coupled with a first terminal of capacitor 356 and first pole circuit output node 352. Capacitor 356 includes the first terminal electrically coupled with the second terminal of resistor 354 and first pole circuit output node 352, and a second terminal electrically coupled to ground. During operation, first pole circuit 308 receives the amplified signal from op-amp 306, and produces a filtered, amplified signal at first pole circuit output node 352. As indicated above, first pole circuit 308 is adapted to attenuate the noise gain produced by op-amp 306.

Active device 316 is electrically coupled between first pole circuit 308 and a filter output 370 of baseband filter 300, and is adapted to amplify the filtered, amplified signal from first pole circuit 308 in order to increase the power of the signal to a level that is adequate for a modulator (e.g., modulator 212, FIG. 2) in a subsequent stage of the transmitter subsystem (e.g., transmitter subsystem 200, FIG. 2). Active device 316 may function as both a voltage buffer and an impedance transformer. Active device 316 may include, for example but not by way of limitation, a source follower that includes a common drain amplifier having a field effect transistor, with a gate terminal electrically coupled with an input node 360, a drain terminal electrically coupled with a voltage reference node 362, and a source terminal electrically coupled with an output node 364. In alternate embodiments, active device 316 may include a different type of amplifier circuit or other active device, such as a common collector circuit that includes a bipolar junction transistor.

The input node 360 of active device 316 is electrically coupled with the first pole circuit output node 352. The voltage reference node 362 is adapted to receive a drain voltage, $V_{DD}$. The output node 364 of active device 316 is electrically coupled with baseband filter output node 370, with a second terminal of second feedback capacitor 312, and with a second terminal of feedback resistor 314. During operation, active device 316 receives the filtered, amplified signal from first pole circuit 308, and amplifies the signal to produce a further amplified baseband filter output signal at the output node 364 of active device 316.

As mentioned above, the output node 364 of active device 316 is coupled with a second terminal of second feedback capacitor 312, and a first terminal of second feedback capacitor 312 is coupled with a first op-amp input terminal 340. Thus, second feedback capacitor 312 forms another portion of the feedback circuitry for op-amp 306. Second feedback capacitor 312 is adapted to control stability of baseband filter 300 and to improve the phase margin and closed loop response of baseband filter 300. In addition, the output node 364 of active device 316 is coupled with a second terminal of feedback resistor 314, and a first terminal of feedback resistor 314 is coupled with RC filter output node 332 and with a first terminal of resistor 304. Thus, feedback resistor 314 forms yet another portion of the feedback circuitry for op-amp 306, and feedback resistor 314 is adapted to scale the signal that is fed back to the inverting input of op-amp 306 (e.g., first op-amp input terminal 340).

Embodiments of baseband filter 300 described above may have one or more advantages over traditional filters employed in transmitter subsystems of wireless communication devices. For example, when an embodiment of baseband filter 300 is included in the transmitter subsystem (e.g., transmitter subsystem 200, FIG. 2), baseband filter 300 may filter a baseband signal (e.g., a baseband signal produced by DAC 208, FIG. 2) in a manner that may have a substantially similar effect to the filtering that might otherwise have been performed using a SAW filter in a traditional transmitter or transceiver. Accordingly, such a SAW filter may be eliminated from the transmitter subsystem design, and thus may decrease manufacturing costs. In addition, by designing baseband filter 300 to include a pole circuit (e.g., pole circuit 308) at the output of op-amp 306, op-amp 306 may be operated using relatively low power, when compared with filters that do not include such a pole circuit. Accordingly, embodiments of baseband filters (e.g., baseband filter 300) may be adapted to provide spectral content filtering while increasing the operational time of a wireless device between battery charges, when compared with other filters. Additional embodiments of baseband filters are illustrated in FIGS. 4-6, and described below.

Figure 4:
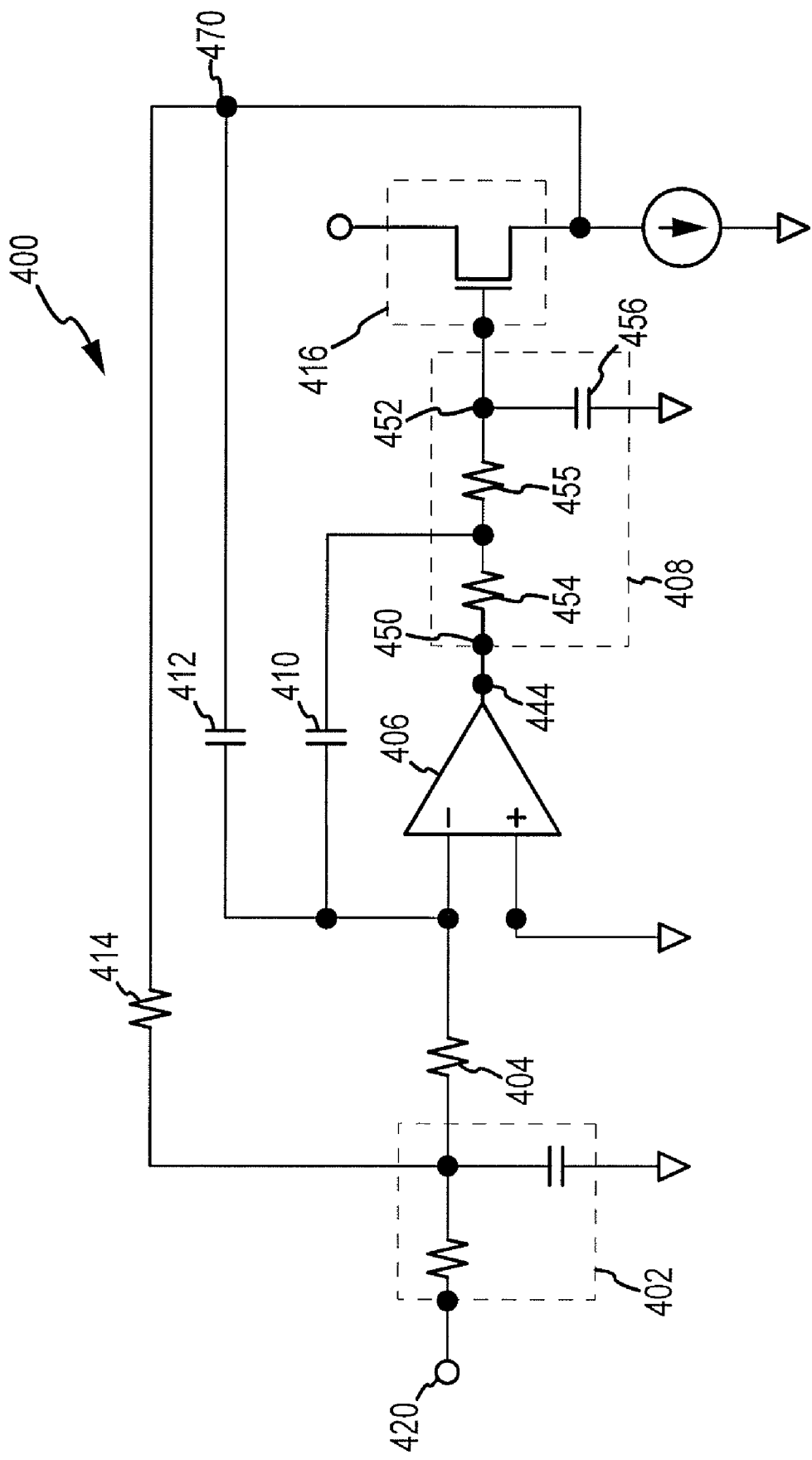
FIG. 4 illustrates a simplified circuit diagram of a portion of a baseband filter, according to another exemplary embodiment.

FIG. 4 illustrates a simplified circuit diagram of a portion of a baseband filter 400 (e.g., baseband filter 210, FIG. 2), according to another exemplary embodiment. Baseband filter 400 is similar to baseband filter 300 (FIG. 3), in that it may include a multiple feedback filter (e.g., a Rauch filter), which is adapted to provide second order noise shaping of a baseband input signal. Baseband filter 400 has distinctions from baseband filter 300, however, and these distinctions are discussed below. Baseband filter 400 includes a baseband filter input node 420, a baseband filter output node 470, an RC filter 402, a resistor 404, an op-amp 406, a first pole circuit 408 on an output side of op-amp 406, a first feedback capacitor 410, a second feedback capacitor 412, a feedback resistor 414, and an active device 416. The functionality of each of the baseband filter 400 components is substantially similar to the functionality of the analogous components of baseband filter 300.

However, a distinction between baseband filter 400 and baseband filter 300 is the configuration of first pole circuit 408. First pole circuit 408 is electrically coupled between op-amp 406 and active device 416. First pole circuit 408 comprises a first pole circuit input node 450, a first pole circuit output node 452, a first resistor 454, a second resistor 455, and a capacitor 456. The first pole circuit input node 450 is electrically coupled with the output terminal 444 of op-amp 406, and the first pole circuit output node 452 is electrically coupled with active device 416. Unlike the baseband filter 300 of FIG. 3, however, a terminal of first feedback capacitor 410 is electrically coupled to a connection point between first resistor 454 and second resistor 455. First resistor 454 includes a first terminal electrically coupled with the first pole circuit input node 450, and a second terminal electrically coupled with a first terminal of second resistor 455. A second terminal of second resistor 455 is electrically coupled with a first terminal of capacitor 456 and first pole circuit output node 452. Accordingly, the first resistor 454 and the second resistor 455 are serially connected with each other between the first pole circuit input node 450 and the first pole circuit output node 452, with the connection point between them. Capacitor 456 includes the first terminal electrically coupled with the second terminal of second resistor 455 and first pole circuit output node 452, and a second terminal electrically coupled to ground. During operation, first pole circuit 408 receives the amplified signal from op-amp 406, and produces a filtered, amplified signal at first pole circuit output node 452. As with the first pole circuit 308 of FIG. 3, first pole circuit 408 functions to attenuate the noise gain produced by op-amp 406.

Figure 5:
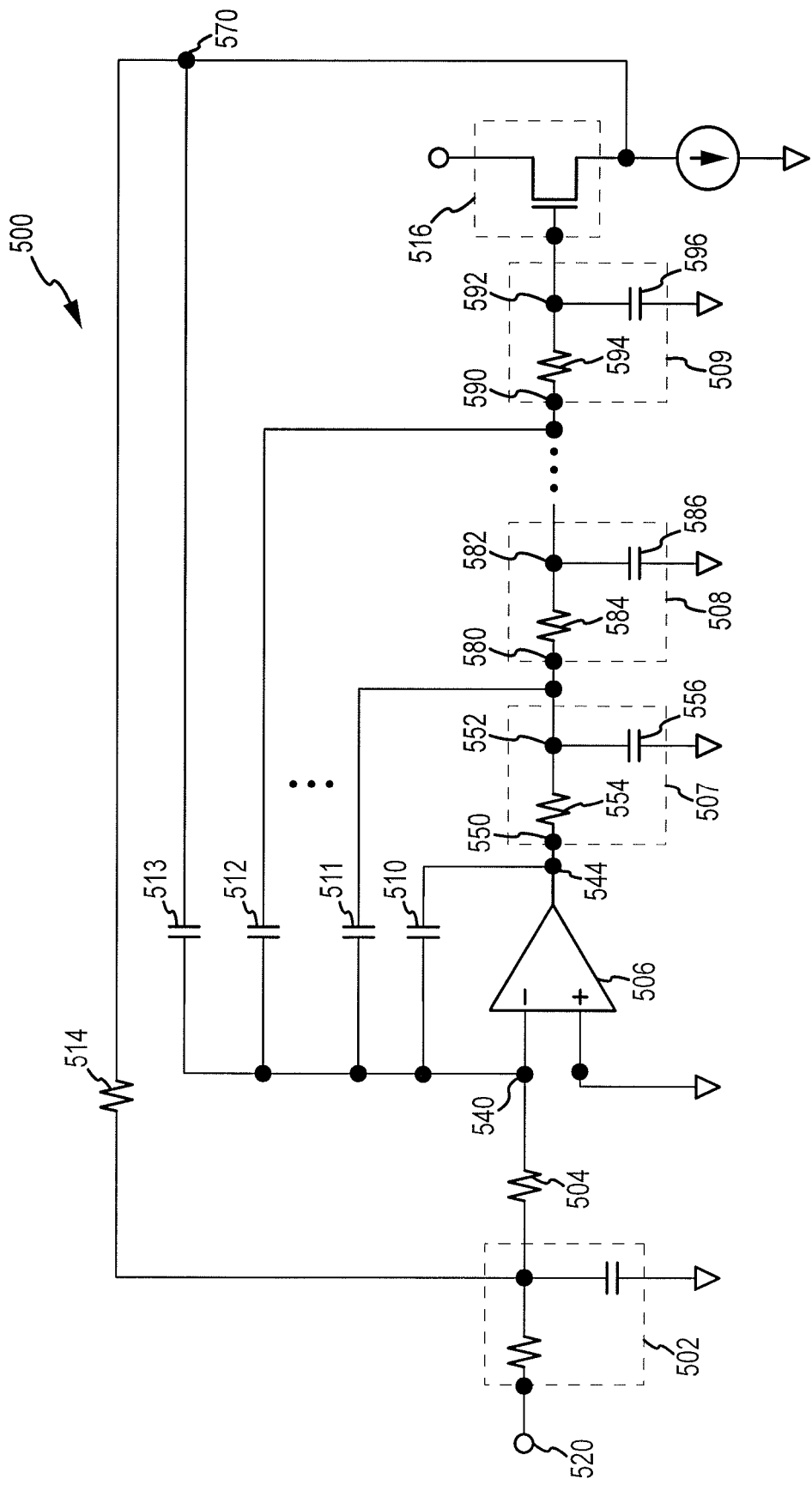
FIG. 5 illustrates a simplified circuit diagram of a portion of a baseband filter, according to another exemplary embodiment.
Figure 6:
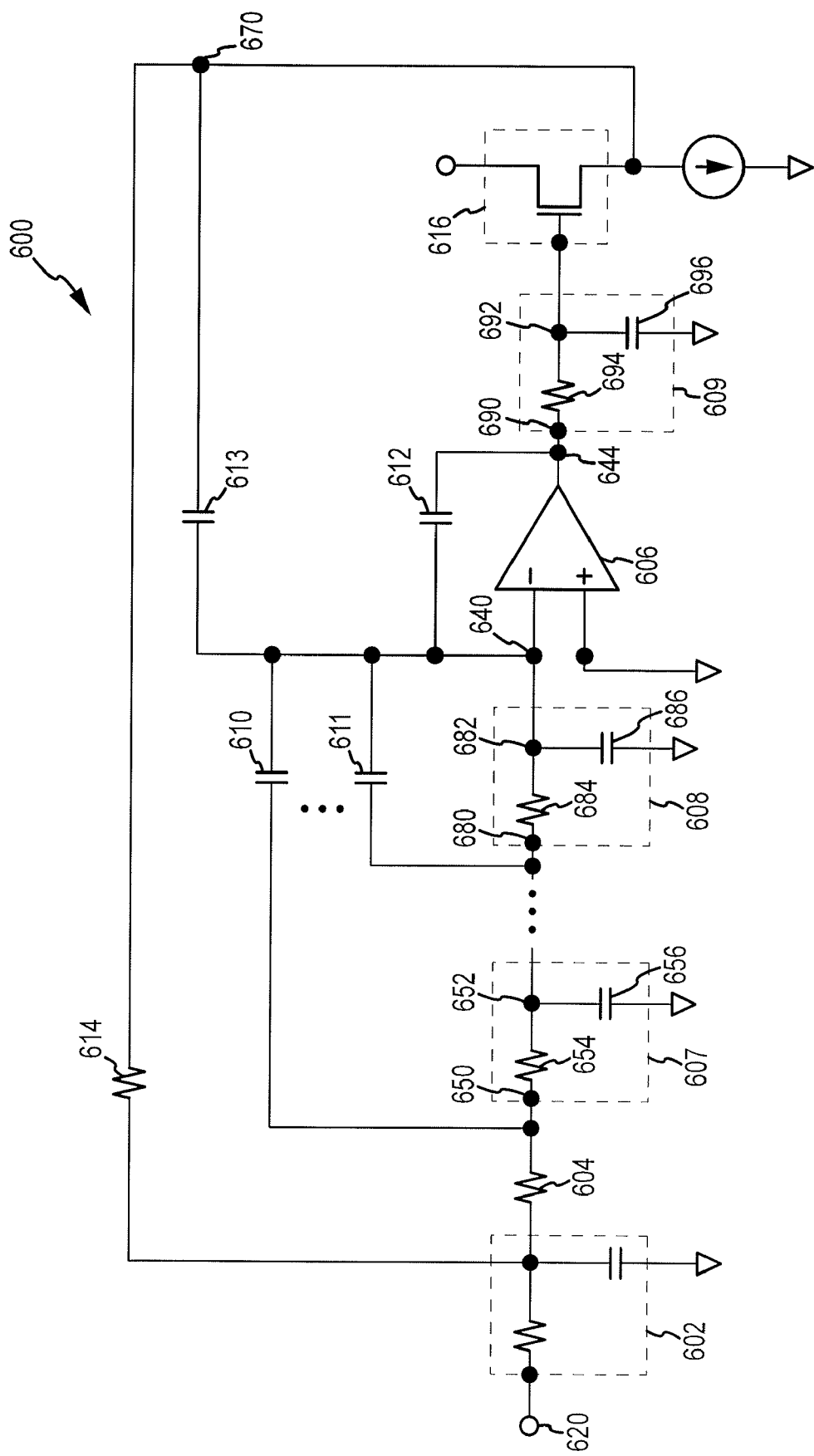
FIG. 6 illustrates a simplified circuit diagram of a portion of a baseband filter, according to another exemplary embodiment.

FIG. 5 illustrates a simplified circuit diagram of a portion of a baseband filter 500 (e.g., baseband filter 210, FIG. 2), according to another exemplary embodiment. Baseband filter 500 is similar to baseband filter 300 (FIG. 3), in that it may include a multiple feedback filter (e.g., a Rauch filter). Baseband filter 500 has distinctions from baseband filter 300, however, and these distinctions are discussed below. Baseband filter 500 includes a baseband filter input node 520, a baseband filter output node 570, an RC filter 502, a resistor 504, an op-amp 506, a plurality of pole circuits 507, 508, 509 on an output side of op-amp 506, a plurality of feedback capacitors 510, 511, 512, 513, a feedback resistor 514, and an active device 516. The functionality of each of the baseband filter 500 components is substantially similar to the functionality of the analogous components of baseband filter 300.

A distinction between baseband filter 500 and baseband filter 300 is that, along with a first pole circuit 507, baseband filter 500 includes at least one additional pole circuit 508, 509 electrically coupled between the first pole circuit 507 and the active device 516 on an output side of op-amp 506. The number, n, of pole circuits 507-509 may be an integer between two and five. For example, according to one embodiment, the number of pole circuits is two. According to another embodiment, the number of pole circuits is three. According to yet another embodiment, the number of pole circuits is four, and according to yet another embodiment, the number of pole circuits is five. In still other embodiments, the number of pole circuits 507-509 may be greater than five. The depiction in FIG. 5 of three pole circuits 507-509 on the output side of op-amp 506 is for example purposes only, and is not meant to be limiting.

Each pole circuit 507-509 is adapted to give rise to another pole of baseband filter 500, and is adapted to filter noise produced by op-amp 506 (e.g., to attenuate the amplifier noise gain) by shunting certain frequencies of the output signal from op-amp 506 to ground. In an embodiment, pole circuits 507-509 may be adapted to provide attenuation within substantially the same and/or substantially overlapping frequency ranges. Accordingly, each pole circuit 507-509 may increase the signal attenuation within the frequency range. In other embodiments, pole circuits 507-509 may be adapted to provide attenuation within different frequency ranges and/or within frequency ranges that only partially overlap each other. Either way, the plurality of pole circuits 507-509 is adapted to provide n-order noise shaping of a baseband input signal.

First pole circuit 507 comprises a first pole circuit input node 550, a first pole circuit output node 552, a resistor 554, and a capacitor 556. Second pole circuit 508 comprises a second pole circuit input node 580, a second pole circuit output node 582, a resistor 584, and a capacitor 586. N-th pole circuit 509 comprises an n-th pole circuit input node 590, an n-th pole circuit output node 592, a resistor 594, and a capacitor 596.

The first pole circuit input node 550 is electrically coupled with the output terminal 544 of op-amp 506 and with a terminal of first feedback capacitor 510, and the first pole circuit output node 552 is electrically coupled with the second pole circuit input node 580. The second pole circuit input node 580 also is electrically coupled with a terminal of second feedback capacitor 511. The second pole circuit output node 582 is electrically coupled with the n-th pole circuit input node 590, although this coupling may be performed through one or more intermediate, additional pole circuits (not illustrated), each of which may be substantially similar to pole circuits 507-509. The n-th pole circuit input node 590 also is electrically coupled with a terminal of n-th feedback capacitor 512, and the n-th pole circuit output node 592 is electrically coupled with active device 516. Opposite terminals of each of the first, second, and n-th feedback capacitors 510-512 are electrically coupled with the first op-amp input terminal 540. Thus, each of the first, second, and n-th feedback capacitors 510-512 is electrically coupled between the pole circuits 507-509 and the first op-amp input terminal 540, and each of the feedback capacitors 510-512 forms a portion of the feedback circuitry for op-amp 506. First feedback capacitor 510 is adapted to compensate for the phase shift applied to the signal by first pole circuit 507, second feedback capacitor 511 is adapted to compensate for the phase shift applied to the signal by second pole circuit 508, and n-th feedback capacitor 512 is adapted to compensate for the phase shift applied to the signal by n-th pole circuit 509. By including a plurality of pole circuits 507-509, the noise gain of op-amp 506 may be attenuated more rapidly over a shorter frequency range.

FIG. 6 illustrates a simplified circuit diagram of a portion of a baseband filter 600 (e.g., baseband filter 210, FIG. 2), according to another exemplary embodiment. Baseband filter 600 is similar to baseband filter 500 (FIG. 5), in that it may include a multiple feedback filter (e.g., a Rauch filter). Baseband filter 600 has distinctions from baseband filter 500, however, and these distinctions are discussed below. Baseband filter 600 comprises a baseband filter input node 620, a baseband filter output node 670, an RC filter 602, a resistor 604, an op-amp 606, at least one pole circuit 607, 608 on an input side of op-amp 606, at least one pole circuit 609 on an output side of op-amp 606, at least one feed forward capacitor 610, 611, at least one feedback capacitor 612, 613, a feedback resistor 614, and an active device 616. The functionality of each of the baseband filter 600 components is substantially similar to the functionality of the analogous components of baseband filter 500.

A distinction between baseband filter 600 and baseband filter 500 is that baseband filter 600 includes at least one pole circuit 607, 608 on an input side of op-amp 606 as well as at least one pole circuit 609 on an output side of op-amp 606. The total number, n, of pole circuits 607-609 may be an integer between two and five, although the number of pole circuits 607-609 alternatively may be greater than five. The depiction in FIG. 6 of two pole circuits 607, 608 on the input side of op-amp 606 and one pole circuit 609 on the output side of op-amp 606 is for example purposes only, and is not meant to be limiting. For example, as few as one pole circuit or more than two pole circuits may be included on the input side of op-amp 606, and/or more than one pole circuit may be included on the output side of op-amp 606. Each pole circuit 607-609 gives rise to another pole of baseband filter 600, although only pole circuit 609 on the output side of op-amp 606 is adapted to filter noise produced by op-amp 606 (e.g., to attenuate the amplifier noise gain). Accordingly, the plurality of pole circuits 607-609 is adapted to provide n order noise shaping of a baseband input signal.

First pole circuit 607 comprises a first pole circuit input node 650, a first pole circuit output node 652, a resistor 654, and a capacitor 656. Second pole circuit 608 comprises a second pole circuit input node 680, a second pole circuit output node 682, a resistor 684, and a capacitor 686. Third pole circuit 609 comprises a third pole circuit input node 690, a third pole circuit output node 692, a resistor 694, and a capacitor 696.

The first pole circuit input node 650 is electrically coupled with a terminal of resistor 604 and with a first terminal of first feed forward capacitor 610, and the first pole circuit output node 652 is electrically coupled with the second pole circuit input node 680, although this coupling may be performed through one or more intermediate, additional pole circuits (not illustrated), each of which may be substantially similar to pole circuits 607-609. The second pole circuit input node 680 is electrically coupled with a first terminal of second feed forward capacitor 611 and the first pole circuit output node 652 (possibly through one or more intermediate pole circuits, as discussed above), and the second pole circuit output node 682 is electrically coupled with a first op-amp input terminal 640 of op-amp 606. The third pole circuit input node 690 is electrically coupled with the output terminal 644 of op-amp 606 and with a terminal of third feedback capacitor 612, and the third pole circuit output node 692 is electrically coupled with active device 616.

Opposite terminals of each of the first and second feed forward capacitors 610, 611 and feedback capacitor 612 are electrically coupled with the first op-amp input terminal 640. First feed forward capacitor 610 is adapted to compensate for the phase shift applied to the signal by first pole circuit 607, second feed forward capacitor 611 is adapted to compensate for the phase shift applied to the signal by second pole circuit 608, and feedback capacitor 612 is adapted to compensate for the phase shift applied to the signal by third pole circuit 609.

Figure 7:
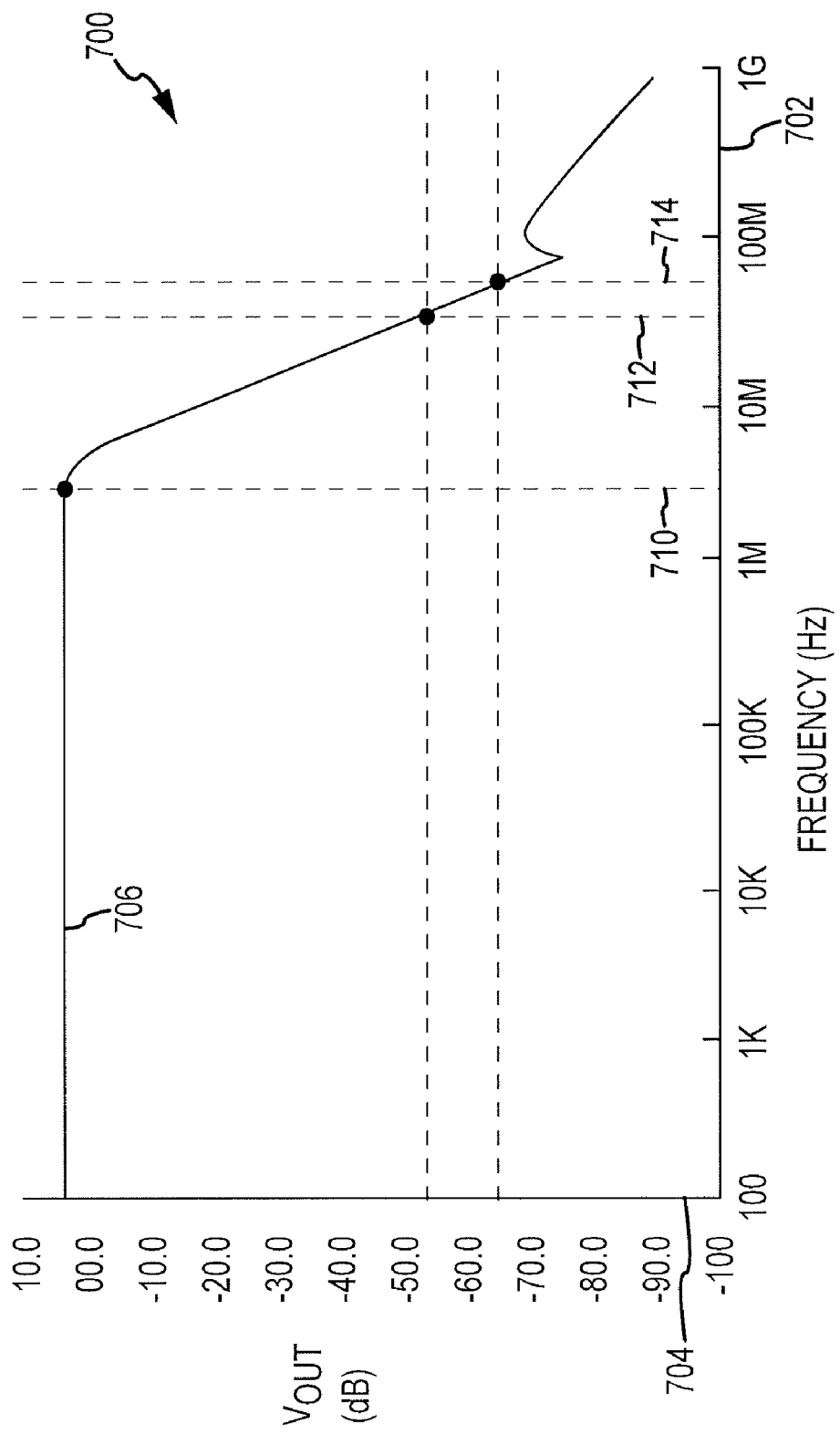
FIG. 7 is a chart plotting the magnitude response of an exemplary embodiment of a baseband filter.

FIG. 7 is a chart 700 plotting the magnitude response of an exemplary embodiment of a baseband filter (e.g., baseband filter 300, 400, 500, 600, FIGS. 3-6). The resistance and capacitance values for the baseband filter embodiments described herein may be selected to attenuate a baseband signal according to a 3GPP ($3^{rd}$ Generation Partnership Project) specification (e.g., a W-CDMA (Wideband Code Division Multiple Access) specification. More particularly, and for example purposes only, such a specification may require noise attenuation for a transmitted signal (e.g., a signal transmitted by device 100, FIG. 1) to be below about 1.4 nV/sqrt(Hz) (nanoVolts per square root Hertz) at about 43 MegaHz. An embodiment of a baseband filter may effectively provide about 3.5 poles of filtering, in order to reduce the noise response of a transmitted signal according to such a specification. In other embodiments, the resistance and capacitance values for the baseband filter embodiments described above may be selected effectively to provide higher or lower poles of filtering, and/or to reduce the noise response of a transmitted signal below a different threshold at a different frequency.

Magnitude response curve 706 of chart 700 represents the noise response for an embodiment of a baseband filter, which is adapted to meet a specification such as that described in the preceding paragraph. Chart 700 includes a frequency axis 702 and an output voltage magnitude axis 704. Magnitude response curve 706 indicates signal attenuation over a range of frequencies (e.g., from 100 Hz to 1 GHz). The baseband filter may be designed so that the magnitude response curve 706 is relatively flat to a corner frequency 710 of about 3 MHz, and the attenuation provided at least in part by the baseband filter causes rapid attenuation above corner frequency 710. In the example illustrated in FIG. 7, the magnitude response curve 706 reflects attenuation of about 51.4 decibels (dB) at a second frequency 712 of about 43 MHz, and attenuation of about 63.8 dB at a third frequency 714 of about 60 MHz. The attenuation characteristics alternatively may be different from those illustrated in FIG. 7.

Although FIG. 7 indicates that embodiments may be adapted to provide attenuation according to a particular mobile communication standard in a particular frequency band, it is to be understood that other embodiments may be adapted to provide attenuation according to other mobile communication standards and/or in other frequency bands, including but not limited to GSM (Global System for Mobile communications), GPRS (General Packet Radio Service), EDGE (Enhanced Data rates for GSM Evolution), CSD (Circuit Switched Data), UMTS (Universal Mobile Telecommunications System), HSPA (High Speed Packet Access), LTE (3GPP Long Term Evolution), CDMA (Code Division Multiple Access, such as cdmaOne, CDMA2000, and so on), iDEN (Integrated Digital Enhanced Network), WiDEN (Wideband Integrated Dispatch Enhanced Network), UMA (Unlicensed Mobile Access), and WiMAX (Worldwide Interoperability for Microwave Access), among others.

Thus, various embodiments of baseband filters have been described. An embodiment includes a baseband filter having a baseband filter input node and a baseband filter output node an op-amp, a first pole circuit, a first feedback capacitor, and an active device. The op-amp has a first op-amp input terminal, a second op-amp input terminal, and an op-amp output terminal, and the op-amp is adapted to produce, at the op-amp output terminal, an amplified signal that includes noise gain produced by the op-amp. The first pole circuit has a first pole circuit input node and a first pole circuit output node, and the first pole circuit input node is electrically coupled with the op-amp output terminal, and the first pole circuit is adapted to receive the amplified signal and to attenuate the noise gain to produce a filtered, amplified signal at the first pole circuit output node. The first feedback capacitor has a first terminal and a second terminal, and the first feedback capacitor is electrically coupled between the first pole circuit and the first op-amp input terminal, and is adapted to compensate for a phase shift produced by the first pole circuit. The active device has an input node and an output node. The input node of the active device is electrically coupled with the first pole circuit output node, and the output node of the active device is electrically coupled with the baseband filter output node, and the active device is adapted to amplify the filtered, amplified signal and to produce a baseband filter output signal at the output node of the active device.

Another embodiment includes a transmitter having a digital-to-analog converter adapted to produce a complex analog signal, a baseband filter electrically coupled with the digital-to-analog converter and adapted to receive and filter the complex analog signal and to produce a filtered baseband signal, a modulator electrically coupled with the baseband filter, where the modulator is adapted to receive and upconvert the filtered baseband signal to produce an RF signal, and an amplifier electrically coupled with the modulator, where the amplifier is adapted to receive and apply a gain to the RF signal.

The baseband filter includes a baseband filter input node, a baseband filter output node, an op-amp, a first pole circuit, a first feedback capacitor, and an active device. The op-amp has a first op-amp input terminal, a second op-amp input terminal, and an op-amp output terminal, and the op-amp is adapted to produce, at the op-amp output terminal, an amplified signal that includes noise gain produced by the op-amp. The first pole circuit has a first pole circuit input node and a first pole circuit output node, and the first pole circuit input node is electrically coupled with the op-amp output terminal, and the first pole circuit is adapted to receive the amplified signal and to attenuate the noise gain to produce a filtered, amplified signal at the first pole circuit output node. The first feedback capacitor has a first terminal and a second terminal, where the first feedback capacitor is electrically coupled between the first pole circuit input node and the first op-amp input terminal, and is adapted to compensate for a phase shift produced by the first pole circuit. The active device has an input node and an output node, and the input node of the active device is electrically coupled with the first pole circuit output node, and the output node of the active device is electrically coupled with the baseband filter output node, and the active device is adapted to amplify the filtered, amplified signal and to produce a baseband filter output signal at the output node of the active device.

Another embodiment includes a wireless device that includes a transmitter subsystem for producing an outgoing RF signal. The wireless device includes a baseband filter adapted to receive and filter a complex analog signal and to produce a filtered baseband signal, a modulator electrically coupled with the baseband filter, where the modulator is adapted to receive and upconvert the filtered baseband signal to produce an RF signal, an amplifier electrically coupled with the modulator, where the amplifier is adapted to receive and apply a gain to the RF signal, and an antenna electrically coupled with the transmitter subsystem and adapted to receive and transmit the outgoing RF signal over an air interface. The baseband filter includes a baseband filter input node, a baseband filter output node, an op-amp, a first pole circuit, a first feedback capacitor, and an active device. The op-amp has a first op-amp input terminal, a second op-amp input terminal, and an op-amp output terminal, and the op-amp is adapted to produce, at the op-amp output terminal, an amplified signal that includes noise gain produced by the op-amp. The first pole circuit has a first pole circuit input node and a first pole circuit output node, and the first pole circuit input node is electrically coupled with the op-amp output terminal, and the first pole circuit is adapted to receive the amplified signal and to attenuate the noise gain to produce a filtered, amplified signal at the first pole circuit output node. The first feedback capacitor has a first terminal and a second terminal, where the first feedback capacitor is electrically coupled between the first pole circuit input node and the first op-amp input terminal, and is adapted to compensate for a phase shift produced by the first pole circuit. The active device has an input node and an output node, and the input node of the active device is electrically coupled with the first pole circuit output node, and the output node of the active device is electrically coupled with the baseband filter output node, and the active device is adapted to amplify the filtered, amplified signal and to produce a baseband filter output signal at the output node of the active device.

While the principles of the inventive subject matter have been described above in connection with specific systems, apparatus, and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. For example, although embodiments discussed herein relate to single ended active filters (e.g., filters in which a single output signal is derived from a single input signal using an active filter network), it is to be understood that embodiments also include the analogous fully differential filters (e.g., filters in which a differential output signal pair is derived from a differential input signal pair though a differential active filter derived from the complementary transformation of its single ended analog). It is to be understood that the inventive subject matter and the scope of the claims is intended to include embodiments of single ended active filters and their analogous, fully differential counterparts. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A baseband filter having a baseband filter input node and a baseband filter output node, the baseband filter comprising:

an operational amplifier (op-amp) having a first op-amp input terminal, a second op-amp input terminal, and an op-amp output terminal, wherein the op-amp is adapted to produce, at the op-amp output terminal, an amplified signal that includes noise gain produced by the op-amp;
a first pole circuit having a first pole circuit input node and a first pole circuit output node, wherein the first pole circuit input node is electrically coupled with the op-amp output terminal, and the first pole circuit is adapted to receive the amplified signal and to attenuate the noise gain to produce a filtered, amplified signal at the first pole circuit output node;
a first feedback capacitor having a first terminal and a second terminal, wherein the first feedback capacitor is electrically coupled between the first pole circuit and the first op-amp input terminal, and is adapted to compensate for a phase shift produced by the first pole circuit; and
an active device having an input node and an output node, wherein the input node of the active device is electrically coupled with the first pole circuit output node, and the output node of the active device is electrically coupled with the baseband filter output node, and wherein the active device is adapted to amplify the filtered, amplified signal and to produce a baseband filter output signal at the output node of the active device.

2. The baseband filter of claim 1, wherein the active device includes a source follower that includes a common drain amplifier having a field effect transistor, with a gate terminal electrically coupled with the input node of the active device, a drain terminal electrically coupled with a voltage reference node, and a source terminal electrically coupled with the output node of the active device.

3. The baseband filter of claim 1, further comprising:
a second feedback capacitor electrically coupled between the output node of the active device and the first op-amp input terminal.

4. The baseband filter of claim 1, wherein the first pole filter comprises:
a first resistor having a first terminal and a second terminal, wherein the first terminal of the first resistor is electrically coupled with the first pole circuit input node, and the second terminal of the first resistor is electrically coupled with the first pole circuit output node; and
a capacitor having a first terminal and a second terminal, wherein the first terminal of the capacitor is electrically coupled with the first pole circuit output node, and the second terminal of the capacitor is electrically coupled to ground.

5. The baseband filter of claim 4, wherein the first pole filter further comprises:
a second resistor serially connected with the first resistor, wherein the first resistor is electrically coupled with the first pole circuit input node through the second resistor, and wherein the first terminal of the first feedback capacitor is electrically coupled with a connection point between the first resistor and the second resistor.

6. The baseband filter of claim 1, further comprising:
an additional pole circuit electrically coupled between the first pole circuit and the active device.

7. The baseband filter of claim 6, further comprising:
an additional feedback capacitor electrically coupled between the additional pole circuit and the first op-amp input terminal.

8. The baseband filter of claim 1, further comprising:
a resistor capacitor filter electrically coupled with the baseband filter input node; and
an additional pole circuit electrically coupled between the resistor capacitor filter and the first op-amp input node.

9. A transmitter subsystem comprising:
a digital-to-analog converter adapted to produce a complex analog signal;
a baseband filter electrically coupled with the digital-to-analog converter and adapted to receive and filter the complex analog signal and to produce a filtered baseband signal, the baseband filter including
a baseband filter input node,
a baseband filter output node,
an operational amplifier (op-amp) having a first op-amp input terminal, a second op-amp input terminal, and an op-amp output terminal, wherein the op-amp is adapted to produce, at the op-amp output terminal, an amplified signal that includes noise gain produced by the op-amp,
a first pole circuit having a first pole circuit input node and a first pole circuit output node, wherein the first pole circuit input node is electrically coupled with the op-amp output terminal, and the first pole circuit is adapted to receive the amplified signal and to attenuate the noise gain to produce a filtered, amplified signal at the first pole circuit output node,
a first feedback capacitor having a first terminal and a second terminal, wherein the first feedback capacitor is electrically coupled between the first pole circuit input node and the first op-amp input terminal, and is adapted to compensate for a phase shift produced by the first pole circuit, and
an active device having an input node and an output node, wherein the input node of the active device is electrically coupled with the first pole circuit output node, and the output node of the active device is electrically coupled with the baseband filter output node, and wherein the active device is adapted to amplify the filtered, amplified signal and to produce a baseband filter output signal at the output node of the active device;
a modulator electrically coupled with the baseband filter, wherein the modulator is adapted to receive and upconvert the filtered baseband signal to produce a radio frequency (RF) signal; and
an amplifier electrically coupled with the modulator, wherein the amplifier is adapted to receive and apply a gain to the RF signal.

10. The transmitter subsystem of claim 9, wherein the active device includes a source follower that includes a common drain amplifier having a field effect transistor, with a gate terminal electrically coupled with the input node of the active device, a drain terminal electrically coupled with a voltage reference node, and a source terminal electrically coupled with the output node of the active device.

11. The transmitter subsystem of claim 9, further comprising:
a second feedback capacitor electrically coupled between the output node of the active device and the first op-amp input terminal.

12. The transmitter subsystem of claim 9, wherein the first pole filter comprises:
a resistor having a first terminal and a second terminal, wherein the first terminal of the resistor is electrically coupled with the first pole circuit input node, and the second terminal of the resistor is electrically coupled with the first pole circuit output node; and
a capacitor having a first terminal and a second terminal, wherein the first terminal of the capacitor is electrically coupled with the first pole circuit output node, and the second terminal of the capacitor is electrically coupled to ground.

13. The transmitter subsystem of claim 9, further comprising:
an additional pole circuit electrically coupled between the first pole circuit and the active device.

14. The transmitter subsystem of claim 13, further comprising:
an additional feedback capacitor electrically coupled between an output node of the additional pole circuit and the first op-amp input terminal.

15. A wireless device comprising:
a baseband filter adapted to receive and filter a complex analog signal and to produce a filtered baseband signal, the baseband filter including
a baseband filter input node,
a baseband filter output node,
an operational amplifier (op-amp) having a first op-amp input terminal, a second op-amp input terminal, and an op-amp output terminal, wherein the op-amp is adapted to produce, at the op-amp output terminal, an amplified signal that includes noise gain produced by the op-amp,
a first pole circuit having a first pole circuit input node and a first pole circuit output node, wherein the first pole circuit input node is electrically coupled with the op-amp output terminal, and the first pole circuit is adapted to receive the amplified signal and to attenuate the noise gain to produce a filtered, amplified signal at the first pole circuit output node,
a first feedback capacitor having a first terminal and a second terminal, wherein the first feedback capacitor is electrically coupled between the first pole circuit input node and the first op-amp input terminal, and is adapted to compensate for a phase shift produced by the first pole circuit, and
an active device having an input node and an output node, wherein the input node of the active device is electrically coupled with the first pole circuit output node, and the output node of the active device is electrically coupled with the baseband filter output node, and wherein the active device is adapted to amplify the filtered, amplified signal and to produce a baseband filter output signal at the output node of the active device;
a modulator electrically coupled with the baseband filter, wherein the modulator is adapted to receive and upconvert the filtered baseband signal to produce a radio frequency (RF) signal;
an amplifier electrically coupled with the modulator, wherein the amplifier is adapted to receive and apply a gain to the RF signal; and
an antenna electrically coupled with the amplifier and adapted to receive and transmit an outgoing RF signal over an air interface.

16. The wireless device of claim 15, further comprising:
a balun, wherein the antenna is electrically coupled with the amplifier through the balun.

17. The wireless device of claim 15, wherein the active device includes a source follower that includes a common drain amplifier having a field effect transistor, with a gate terminal electrically coupled with the input node of the active device, a drain terminal electrically coupled with a voltage reference node, and a source terminal electrically coupled with the output node of the active device.

18. The wireless device of claim 15, wherein the first pole filter comprises:
a resistor having a first terminal and a second terminal, wherein the first terminal of the resistor is electrically coupled with the first pole circuit input node, and the second terminal of the resistor is electrically coupled with the first pole circuit output node; and
a capacitor having a first terminal and a second terminal, wherein the first terminal of the capacitor is electrically coupled with the first pole circuit output node, and the second terminal of the capacitor is electrically coupled to ground.

19. The wireless device of claim 15, further comprising:
an additional pole circuit electrically coupled between the first pole circuit and the active device.

20. The wireless device of claim 19, further comprising:
an additional feedback capacitor electrically coupled between an output node of the additional pole circuit and the first op-amp input terminal.

21. The wireless device of claim 15, wherein the wireless device is a device selected from a group of devices that includes a cellular telephone, a radio, a personal data assistant, and a computer.

* * * * *